United States Patent [19]
Moroi

[11] Patent Number: 5,726,490
[45] Date of Patent: Mar. 10, 1998

[54] SEMICONDUCTOR DEVICE

[75] Inventor: Sadayuki Moroi, Tokyo, Japan

[73] Assignee: NEC Corporation, Japan

[21] Appl. No.: 531,119

[22] Filed: Sep. 20, 1995

[30] Foreign Application Priority Data

Sep. 26, 1994 [JP] Japan ................... 6-254189

[51] Int. Cl.$^6$ ................... H01L 23/495
[52] U.S. Cl. ................... 257/666; 257/676; 257/691; 257/692
[58] Field of Search ................... 257/666, 676, 257/691, 692

[56] References Cited

FOREIGN PATENT DOCUMENTS

| 474469 | 3/1992 | European Pat. Off. ............ | 257/666.2 |
| 63-246851 | 10/1988 | Japan . | |
| 3-60050 | 3/1991 | Japan ................... | 257/666.2 |
| 4-199563 | 7/1992 | Japan ................... | 257/666.2 |
| 6-169051 | 6/1994 | Japan ................... | 257/676 |

OTHER PUBLICATIONS

U.S. application No. 07/002,144, Mallik et al., filed Jan. 12, 1987.

Primary Examiner—Wael Fahmy
Assistant Examiner—Roy Potter
Attorney, Agent, or Firm—Hayes, Soloway, Hennessey, Grossman & Hage, P.C.

[57] ABSTRACT

A leadframe assembly is used in which a ground metal plane (1) having a ground external lead (2), an annular insulating tape (4), a power supply metal plane (5) having a power supply external lead (6), an annular insulating tape (4') and a leadframe (7) having signalling internal and external leads (8, 9) with the ground and power supply external leads removed are sequentially laminated from below. Since each metal plane is provided with a resin sealing dam bar (3) of the same form as that of the leadframe (7), they can be sealed with resin together, and then the resin sealing dam bar (3) is removed and the leads (2, 6, 9) are formed to complete the semiconductor device. Thus, the process for joining the metal planes to the ground and power supply external leads becomes unnecessary, and an inexpensive semiconductor device can be realized.

11 Claims, 4 Drawing Sheets

SEMICONDUCTOR DEVICE

FIELD OF THE INVENTION

The present invention relates to a semiconductor device and a method of manufacturing the same and, in particular, to a semiconductor device having improved electrical characteristics and a method of manufacturing the same.

BACKGROUND OF THE INVENTION

Conventionally, for manufacturing a semiconductor device having improved electrical characteristics such as reduced inductance between a power bond pad and ground bond pad, one method of accommodating integrated circuit semiconductor chip within a plastic package, as will be described later, has been proposed in, for example, Japanese Patent Application Laid-Open No. 63-246851.

FIG. 1 is a perspective view for explaining a leadframe assembly of a conventional semiconductor device disclosed in the foregoing Japanese Patent Application Laid-Open No. 63-246851. FIG. 2 is a partial, cross-sectional view of the semiconductor device using the leadframe assemby illustrated in FIG. 1.

Referring to FIG. 1, this conventional semiconductor device is formed by laminating an annular insulating tape 4', a power supply metal plane or plate 5, an annular insulating tape 4 and a ground metal plane or plate 1 in this order on the lower surface of a lead frame 7 comprising an inner lead 8 and an outer lead 9, and joining a tab (welding tab) 14 each formed at the outer periphery of the planes 5 and 1 to a predetermined power supply lead and a ground lead of the inner lead 8 by electric welding.

Then, as shown in FIG. 2, a power supply electrode pad on the semiconductor chip 10 is electrically connected to the power supply metal plane 5 by means of a bonding wire 11, and the ground electrode pad of the semiconductor chip 10 is electrically connected to the ground metal plane 1 by means of a bonding wire 11. The ground metal plane 1 and the power supply metal plane 5 are each joined to the internal lead 8 to which each tab 14 corresponds so that they are electrically connected to each internal lead 8.

In the foregoing arrangement, at a power supply line and a ground line for the semiconductor chip 10, it becomes unnecessary to directly connect the ground terminal pad and the power supply terminal pad to various ground leads and power leads, and since the path of the lead portion, which is great in inductance, at the multiple lead semiconductor device and the like is replaced by the metal plane portion, which is small in inductance, the inductance can be reduced greatly.

However, in the foregoing conventional semiconductor device, since it is necessary to join the tab formed at the outer periphery of the power supply metal plane and the ground metal plane to a predetermined power supply lead and ground lead of the internal lead by electric welding, a high level welding skill becomes necessary thus causing increase of cost.

Further, the joined portion is likely to be damaged because of poor welding or the thermal stress generated in soldering processes such as IR reflow or the like for manufacturing the semiconductor device, thus causing reliability problems in the device.

SUMMARY OF THE INVENTION

Accordingly, an object of the present invention is to provide an inexpensive semiconductor device and a method of manufacturing the same by eliminating the foregoing problems, incorporating the metal planes and reducing the inductance of the power supply line and the ground line for the integrated circuit semiconductor chip.

In order to achieve the foregoing end, the present invention provides a semiconductor device formed by laminating:

a ground metal plane on which a lead serving as a ground terminal is provided;

a power supply metal plane on which a lead serving as a power supply terminal is provided; and a leadframe in which a lead is removed at the position corresponding to each lead of the ground metal plane and the power supply metal plane.

In the present invention, the ground metal plane, power supply metal plane and leadframe are prefrably positioned in this order. Preferably, a first insulation member is positioned between the ground metal plane and the power supply metal plane and a second insulation member is positioned between the power supply metal plane and the leadframe. Preferably, a semiconductor chip is loaded on the ground metal plane and an opening is formed in each of the power supply metal plane, first insulation member and second insulation member at a position corresponding to the semiconductor chip. Preferably, a ground pad and a power pad of the semiconductor chip are connected to the ground metal plane and the power supply metal plane, respectively, by means of a bonding wire.

In another feature of the present invention, the power supply metal plane, ground metal plane and leadframe are positioned in this order. Preferably, a first insulation member is positioned between the power supply metal plane and the ground metal plane and a second insulation member is positioned between the ground metal plane and the leadframe. Preferably, a semiconductor chip is loaded on the power supply metal plane and an opening is formed in each of the ground metal plane, first insulation member and second insulation member at a position corresponding to the semiconductor chip. Preferably, a ground pad and a power pad of the semiconductor chip are connected to the ground metal plane and the power supply metal plane, respectively, by means of a bonding wire.

In the semiconductor device according to the present invention, the ground metal plane and power supply metal plane each have a dam bar for plastic packaging of the same form as that of the leadframe.

Further, in the semiconductor device according to the present invention, the ground metal plane, power supply metal plane and leadframe each have a hole for positioning at a predetermined position.

In another aspect of the present invention, there is provided a method of manufacturing a semiconductor device comprising steps of:

disposing a first insulation member on a first electrically conductive plate on which a first group of leads comprising one or a plurality of leads is provided;

disposing, on the first insulation member, a second electrically conductive plate on which a second group of leads comprising one or a plurality of leads is provided;

disposing a second insulation member on the second electrically conductive plate;

disposing a leadframe on the second insulation member, the leadframe being formed so that a lead is removed at the position corresponding to the first and second groups of leads of the first and second electrically conductive plates;

electrically connecting a first group of electrodes of a semiconductor chip which is disposed on the first electrically conductive plate to the first electrically conductive plate;

electrically connecting a second group of electrodes of the semiconductor chip to the second electrically conductive plate; and electrically connecting the other group of electrodes of the semiconductor chip to a lead of the leadframe.

In the manufacturing method of the present invention, preferably, the first and second groups of leads are each formed extending outwardly as an external lead.

In the manufacturing method of the present invention, preferably, a dam bar for plastic packaging having substantially the same planar form as that of a dam bar which is provided on the leadframe is formed on the first and second electrically conductive plates.

In the manufacturing method of the present invention, preferably, the first insulation member, second electrically conductive plate, second insulation member and leadframe each comprise an opening at the central portion in order to receive the semiconductor chip.

In the manufacturing method of the present invention, preferably, a positioning hole for use in laminating process is provided at a predetermined position of each of the first electrically conductive plate, second electrically conductive plate and leadframe.

In the semiconductor device of the present invention, a leadframe assembly is used in which a ground metal plane having an external lead serving as a ground terminal, a power supply metal plane having an external lead serving as a power supply terminal and a leadframe comprising an internal lead and an external lead without a ground lead and a power supply lead corresponding to the ground and power supply terminals are laminated, and the ground metal plane and the power supply metal plane each comprise a dam bar for plastic packaging of the same form as that of the leadframe to thereby improve the electrical characteristics such as reducing the inductance of the power supply line and the ground line as well as obtaining a semiconductor device in which the ground metal plane, the power supply metal plane and the external leads each corresponding to the ground and power supply metal planes are previously integrated with the result that the electric welding, which has conventionally been carried out for joining the tab to the lead, becomes unnecessary thus achieving reduction of cost of the semiconductor device.

Further, in the semiconductor device of the present invention, because of absence of the joining portion formed by welding, it cannot be damaged due to poor interconnection caused by poor welding, or thermal stress generated when the semiconductor device is soldered and installed by a method such as IR fellow, and a reliable semiconductor device can be provided.

Still further, according to the present invention, during lamination, each external lead of the ground and power supply metal planes which are laminated to the leadframe can be positioned relative to the leadframe at a high accuracy by inserting a jig pin or the like into the positioning hole.

Similarly, according to the method of the present invention, a semiconductor device can be obtained in which the ground metal plane, the power supply metal plane and the external leads each corresponding to the ground and power supply metal planes are previously integrated, and the joining process such as electric welding or the like, which has conventionally been necessary, becomes unnecessary to achieve reduction of cost.

DESCRIPTION OF THE PREFERRED EMBODIMENTS

A few embodiments of the present invention are described with reference to the accompanying drawings.

Figure 1:
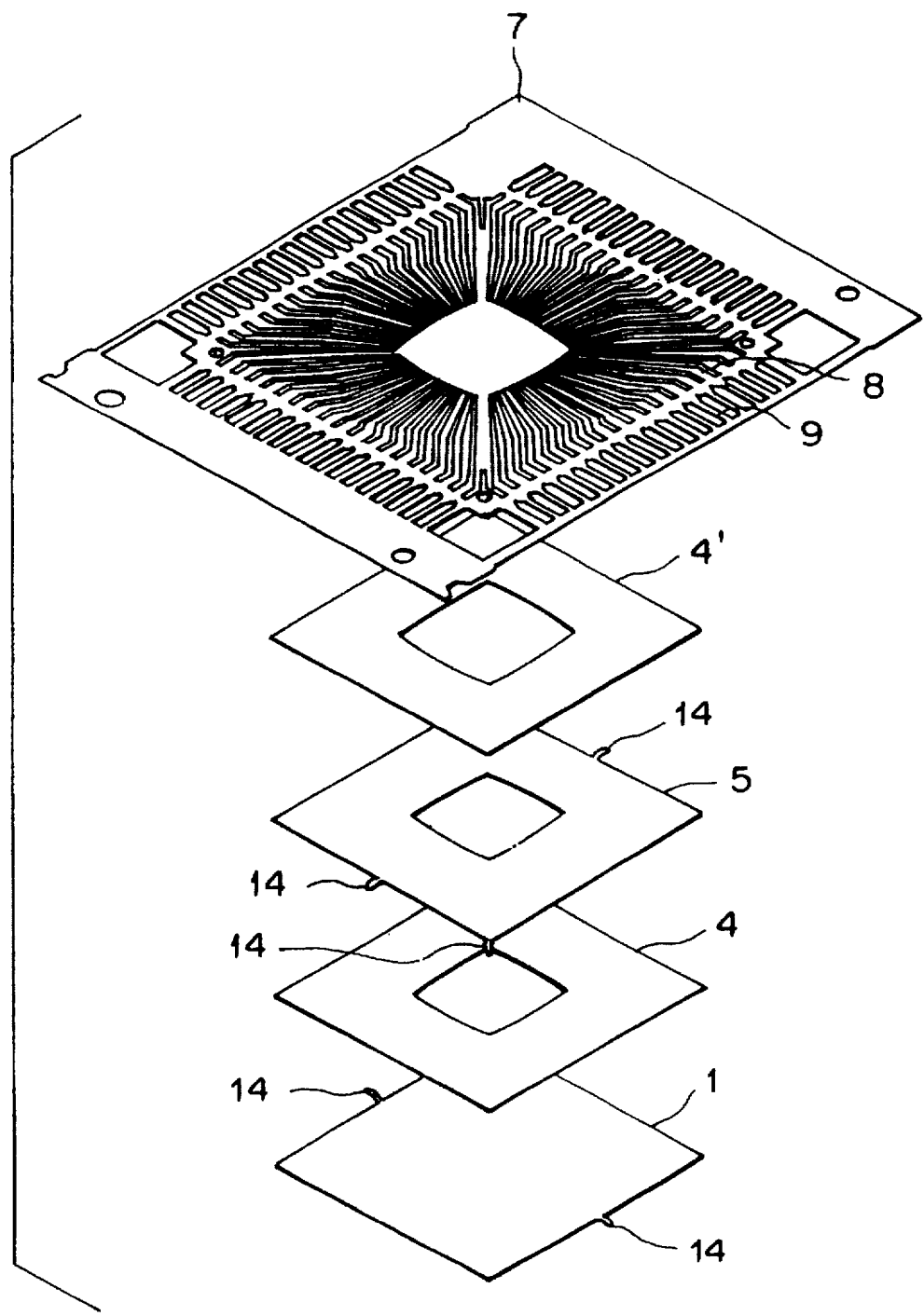
FIG. 1 is a perspective view illustrating a leadframe assembly in a conventional semiconductor device.
Figure 2:
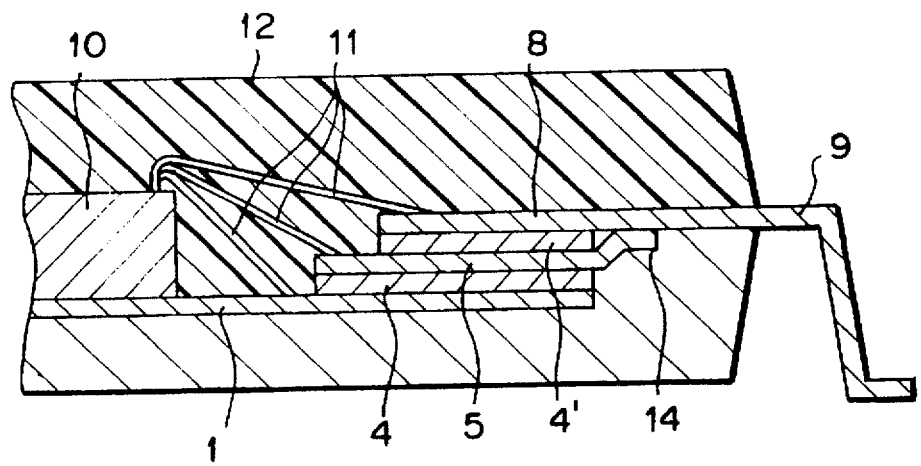
FIG. 2 is a partial, cross-sectional view of a semiconductor device using the leadframe assembly of FIG. 1.
Figure 4:
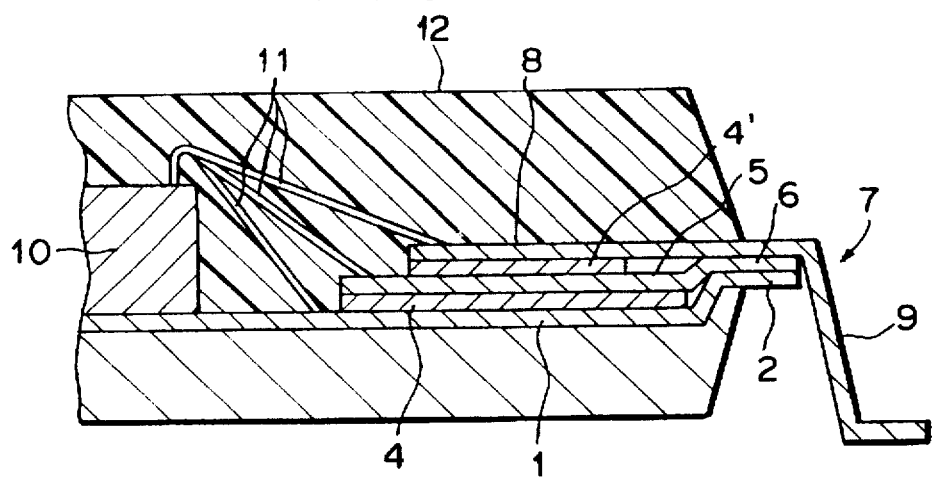
FIG. 4 is a partial, cross-sectional view of a semiconductor device using the leadframe assembly of FIG. 3 according to the first embodiment of the present invention.
Figure 3:
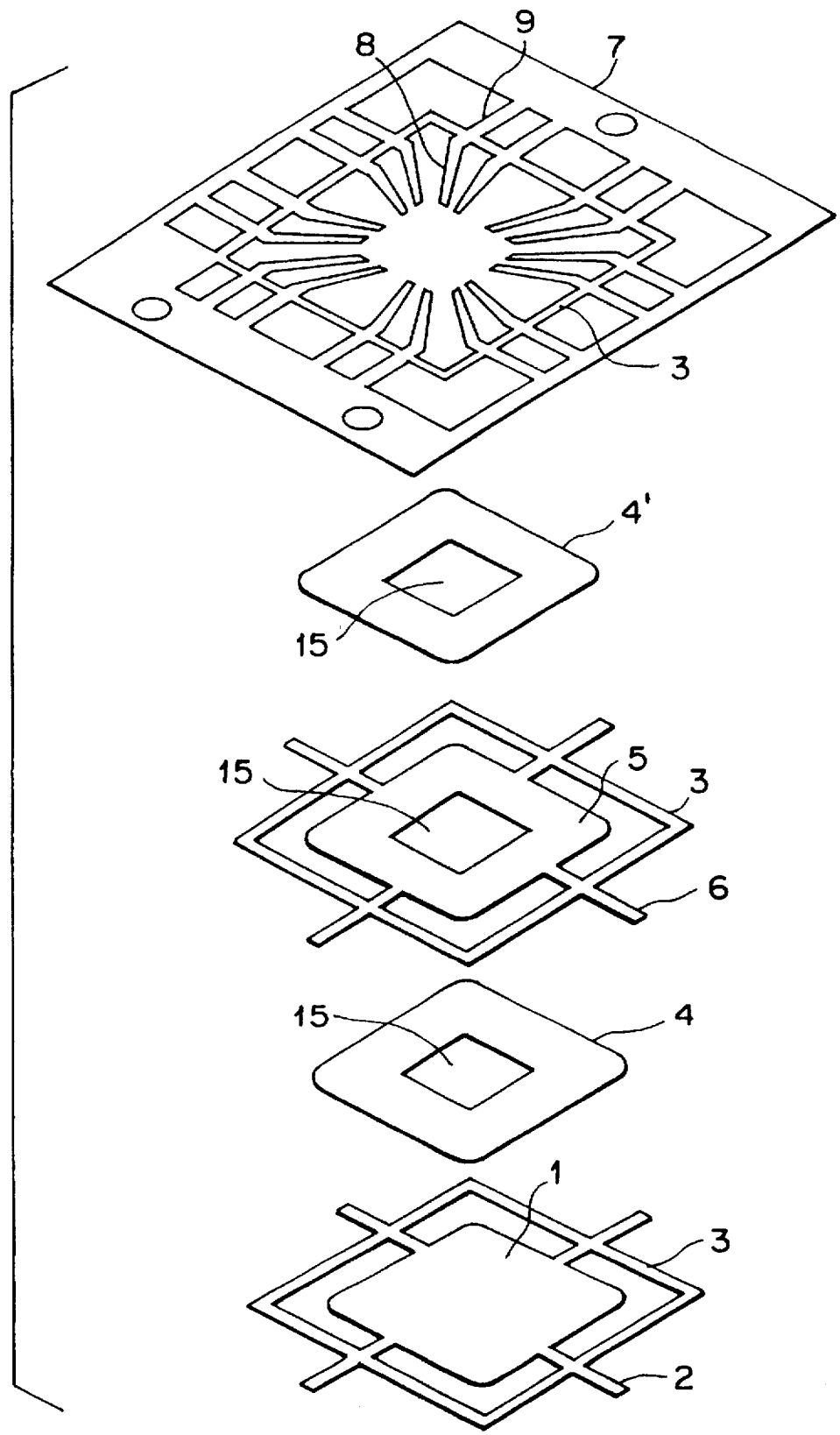
FIG. 3 is a perspective view illustrating a leadframe assembly in a semiconductor device according to a first embodiment of the present invention.

FIG. 3 is a perspective view for explaining a leadframe assembly in a semiconductor device according to a first embodiment of the present invention and FIG. 4 is a partial, cross-sectional view of a semiconductor device using the leadframe assembly shown in FIG. 3.

The arrangement of a leadframe assembly of the semiconductor device according to this embodiment is illustrated in FIG. 3. A ground metal plane or plate 1 having an external lead 2 serving as the ground terminal, an annular insulating adhesive tape 4 having an opening 15, an annular power supply metal plane or plate 5 having an opening 15 and an external lead 6 serving as the power supply terminal, an annular insulating adhesive tape 4' having an opening 15 and a leadframe 7 comprising an internal lead 8 and an external lead 9 are positioned in this order from below and laminated together.

Figure 6:
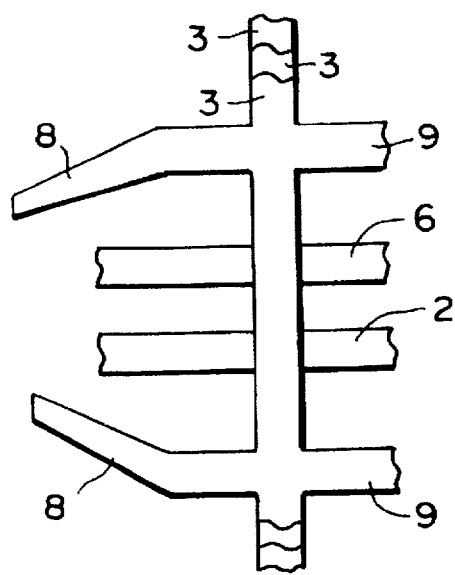
FIG. 6 is a partial, plan view of the leadframe assembly of FIG. 3.

Referring to the leadframe 7, as shown in FIG. 3, internal and external leads corresponding to an external lead 2 provided on the ground metal plane 1 and an external lead 6 provided on the power supply metal plane 5 are removed and, after they are laminated, all the external leads are well aligned as shown in FIG. 6.

Further, the ground metal plane 1 and the power supply metal plane 5 each comprise a dam bar 3, which is used in plastic packaging or sealing with resin 12, of the same form as that of the leadframe 7.

As shown in FIG. 4, a semiconductor integrated circuit chip 10 is loaded on the upper surface of the ground metal plane 1, and the ground electrode pad on the semiconductor chip 10 is electrically connected to the ground metal plane 1 by a bonding wire 11, the power supply electrode pad on the semiconductor chip 10 is electrically connected to the power supply metal plane 5 by a bonding wire 11 and the signal electrode pad on the semiconductor chip 10 is electrically connected to each internal lead 8 by a bonding wire 11.

During plastic packaging or resin sealing, as described above, each metal plane can be sealed with resin together because it comprises the dam bar 3 of the same form as that of the leadframe 7.

The dam bar 3 of the metal planes can easily be removed by simultaneously cutting in the process in which the dam bar 3 of the leadframe 7 is cut and removed, and the semiconductor device becomes finished by forming each external lead to a predetermined form.

As described above, according to the present embodiment, a semiconductor device is obtained in which the ground metal plane, the power supply metal plane and the external leads each corresponding to the ground and power supply metal planes are previously integrated, and the electric welding process which has been conventionally carried out for joining, becomes unnecessary with the result that cost can be significantly reduced.

Figure 5:
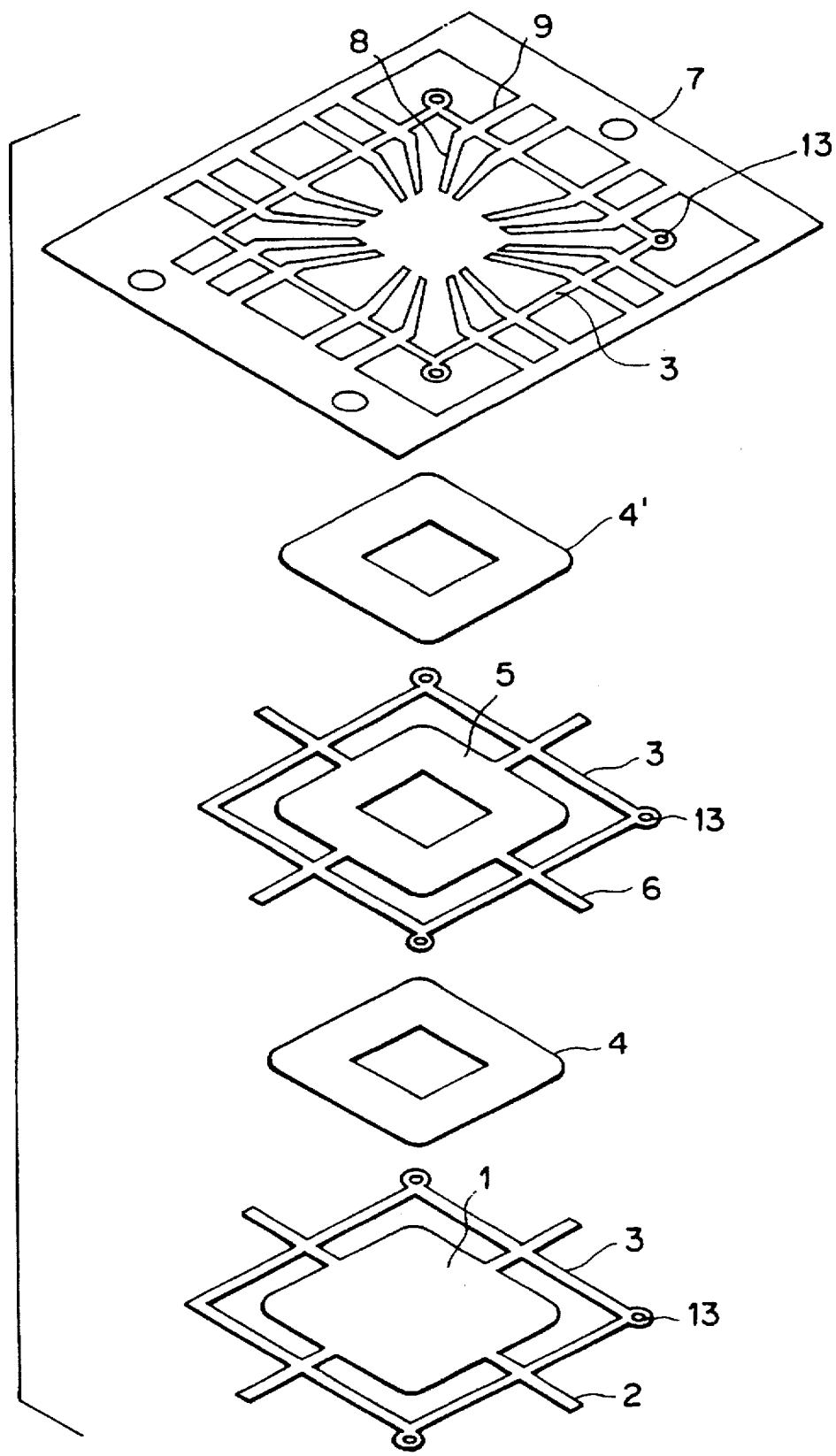
FIG. 5 is a perspective view illustrating a leadframe assembly in a semiconductor device according to a second embodiment of the present invention.

A second embodiment of the present invention is explained with reference to the drawings. FIG. 5 is a perspective view for explaining a leadframe assembly in the semiconductor device according to the second embodiment of the present invention.

This embodiment differs from the first one in that a positioning hole 13 is provided which is common to each laminated member, i.e. the ground metal plane 1, power supply metal plane 5 and the leadframe 7. In this embodiment, during laminating process, the positioning holes 13 provided in each member to be laminated are aligned by means of a jig pin or the like.

With such an arrangement, each external lead of the ground and power supply metal planes which are laminated to the leadframe can be positioned at high accuracies with an error of below ±0.1 mm relative to the leadframe, and a semiconductor device can be obtained having a positional accuracy which is practically free from any problem similar to the conventional device with all external leads integrally formed within the leadframe.

It should not be understood that the present invention is restricted to the foregoing embodiments, but it is intended to include all embodiments following the technical ideas represented by the descriptions of the appended claims. For example, the present invention includes semiconductor devices which differ from the foregoing embodiments in that the reference numerals 1, 2, 5 and 6 denote the power supply metal plane, the external lead serving as the power supply terminal, the ground metal plane and the external lead serving as the ground terminal respectively, namely, the power supply metal plane and the ground metal plane are exchanged for each other.

As described above, according to the present invention, the ground metal plane having the external lead serving as the ground terminal, the power supply metal plane having the external lead serving as the power supply terminal and the leadframe comprising the internal lead and the external lead without the corresponding ground and power supply leads are laminated to improve the electrical characteristics such as reduction of inductance along the power supply line and the ground line while obtaining the semiconductor device in which the ground metal plane, the power supply metal plane and the external leads each corresponding to the ground and power supply metal planes are previously integrated, and the joining process such as electric welding or the like becomes unnecessary with the result that cost per piece can be reduced.

Further, in the present invention, since the ground metal plane and the power supply metal plane comprise resin sealing dam bars of the same form as that of the leadframe, a semiconductor device in which the ground metal plane, the power supply metal plane and the external leads each corresponding to the ground and power supply metal planes are previously integrated is obtained without using joining process such as electric welding or the like, and further, since resin sealing can be done simultaneously for the ground and power supply metal planes together, manufacturing cost can be reduced.

Further, in the semiconductor device of the present invention, because of absence of the joining portion, it cannot be damaged due to poor interconnection through poor welding, or thermal stress encountered when the semiconductor device is soldered and installed by a method such as IR fellow, and a reliable semiconductor device can be provided.

Still further, according to the present invention, a positioning hole is provided which is common to the ground metal plane, power supply metal plane and the leadframe and, during the laminating process, this is positioned by means of a jig pin or the like to thereby position each external lead of the ground and power supply metal planes which is laminated on the leadframe relative to the leadframe at an extremely high accuracy.

Also in the method according to the present invention, a semiconductor device in which the ground metal plane, the power supply metal plane and the external leads each corresponding to the ground and power supply metal planes are previously integrated is obtained, and joining process such as electric welding or the like, which has conventionally been necessary, becomes unnecessary thereby making easier the manufacturing process to achieve reduction of manufacturing cost as well as achieving improvement of reliability of the semiconductor device.

What is claimed is:

1. A semiconductor device, comprising:
   a semiconductor chip having a ground electrode pad, power supply electrode pad and a plurality of signal electrode pads;
   a conductive ground metal plane having a first lead serving as a ground terminal which extends outwardly, wherein said semiconductor chip is loaded on said ground metal plane and said ground electrode pad is connected to said ground metal plane via a first bonding member;
   a first insulation member positioned on said ground metal plane;
   a power supply metal plane having a second lead serving as a power supply terminal which extends outwardly, wherein said power supply electrode pad is connected to said power supply metal plane via a second bonding member;
   a second insulation member positioned on said power supply metal plane; and
   a leadframe having a plurality of third leads each of which comprises an internal lead and an external lead, wherein each of said signal electrode pads is connected to a respective internal lead of each of the third leads by a third bonding member;
   said first lead, said second lead and said third leads being arranged in such a manner that the first lead and the second lead are located in positions other than those corresponding to said third leads, and wherein said metal planes are unpenetrated by said first and second leads.

2. A semiconductor device as set forth in claim 1, wherein said device further comprises an opening in each of said power supply metal plane, first insulation member and second insulation member at a position corresponding to said semiconductor chip.

3. A semiconductor device as set forth in claim 1, wherein said ground metal plane and said power supply metal plane each have a dam bar for plastic packaging of the same form as that of the leadframe.

4. A semiconductor device as set forth in claim 1, wherein said ground metal plane, power supply metal plane and leadframe each have a hole for positioning at a predetermined position.

5. A semiconductor device as set forth in claim 1, wherein said first lead and said second lead are arranged in such a manner that the first lead is located in position other than that corresponding to said second lead.

6. A semiconductor device as set forth in claim 1, wherein each of said first bonding member, second bonding member and third bonding member is a respective bonding wire.

7. A semiconductor device, comprising:
- a semiconductor chip having a ground electrode pad, power supply electrode pad and a plurality of signal electrode pads;
- a conductive power supply metal plane having a first lead serving as a power supply terminal which extends outwardly, wherein said semiconductor chip is loaded on said power supply metal plane and said power supply electrode pad is connected to said power supply metal plane via a first bonding member;
- a first insulation member positioned on said power supply metal plane;
- a ground metal plane having a second lead serving as a ground terminal which extends outwardly, wherein said ground electrode pad is connected to said ground metal plane via a second bonding member;
- a second insulation member positioned on said ground metal plane; and
- a leadframe having a plurality of third leads each of which comprises an internal lead and an external lead, wherein each of said signal electrode pads is connected to a respective internal lead of each of the third leads via a third bonding member,
- said first lead, said second lead and said third leads being arranged in such a manner that the first and the second leads are located in positions other than those corresponding to said third leads, and wherein said metal planes are unpenetrated by said first and second leads.

8. A semiconductor device as set forth in claim 7, wherein said device further comprises an opening in each of said ground metal plane, first insulation member and second insulation member at a position corresponding to said semiconductor chip.

9. A semiconductor device as set forth in claim 7, wherein said first lead and said second lead are arranged in such a manner that the first lead is located in position other than that corresponding to said second lead.

10. A semiconductor device as set forth in claim 7, wherein each of said first bonding member, second bonding member and third bonding member is a respective bonding wire.

11. A semiconductor device as set forth in claim 7, wherein said power supply metal plane, ground metal plane and leadframe each have a hole for positioning at a predetermined position.

* * * * *